United States Patent
Getchel et al.

[11] Patent Number: 6,073,681
[45] Date of Patent: Jun. 13, 2000

[54] WORKPIECE CHUCK

[75] Inventors: Paul A. Getchel, Placerville, Calif.;
Kenneth M. Cole, Sr., Holliston;
Henry A. Lyden, Wellesley, both of Mass.

[73] Assignee: Temptronic Corporation, Newton, Mass.

[21] Appl. No.: 09/001,893

[22] Filed: Dec. 31, 1997

[51] Int. Cl.⁷ ................................ F28F 7/00; B25B 11/00
[52] U.S. Cl. .................... 165/80.1; 165/80.2; 165/82; 165/185; 118/728; 269/21; 269/903
[58] Field of Search .................... 165/80.1, 80.2, 165/80.4, 185, 81, 82; 269/21, 903; 118/728

[56] References Cited

U.S. PATENT DOCUMENTS

| | | | |
|---|---|---|---|
| 4,607,220 | 8/1986 | Hollman . | |
| 4,682,857 | 7/1987 | Tan . | |
| 4,734,872 | 3/1988 | Eager et al. . | |
| 4,781,244 | 11/1988 | Kuramitsu et al. . | |
| 4,893,914 | 1/1990 | Hancock et al. . | |
| 5,033,538 | 7/1991 | Wagner et al. | 165/80.1 |
| 5,034,688 | 7/1991 | Moulene et al. | 165/80.4 X |
| 5,281,794 | 1/1994 | Uehara et al. | 269/21 X |
| 5,567,267 | 10/1996 | Kazama et al. | 165/80.2 X |
| 5,578,532 | 11/1996 | Van De Ven et al. | 118/728 X |
| 5,610,529 | 3/1997 | Schwindt . | |
| 5,738,165 | 4/1998 | Imai | 165/80.2 |

FOREIGN PATENT DOCUMENTS

| | | | |
|---|---|---|---|
| 0 743 530 A2 | 11/1996 | European Pat. Off. . | |
| 2668969 | 5/1992 | France | 269/21 |
| 58-173392 | 10/1983 | Japan . | |

*Primary Examiner*—Leonard Leo
*Attorney, Agent, or Firm*—Samuels, Gauthier & Stevens LLP

[57] ABSTRACT

A workpiece chuck includes an upper assembly on which can be mounted a flat workpiece such as a semiconductor wafer. A lower assembly is mountable to a base that supports the chuck. A non-constraining attachment means such as vacuum, springs or resilient washers applied to the chuck holds the upper assembly to the lower assembly, the lower assembly to the base and can hold the wafer to the top surface of the upper assembly. A heater and a heat sink can be included in the bottom assembly to allow for temperature cycle testing of the wafer. By holding the chuck together by non-constraining means, the chuck layers can move continuously relative to each other under expansion forces caused by temperature effects. Mechanical stresses on the chuck and resulting deformation of the chuck and workpiece over temperature are substantially eliminated.

38 Claims, 8 Drawing Sheets

WORKPIECE CHUCK

FIELD OF THE INVENTION

The present invention relates generally to chucks used to hold flat workpieces and specifically to chucks which hold workpieces such as semiconductor wafers and control the temperature of the workpieces.

BACKGROUND OF THE INVENTION

In the semiconductor integrated circuit industry, the cost of individual integrated circuit chip die is continuing to decrease in comparison to IC package costs. Consequently, it is becoming more important to perform many IC test and evaluation steps while the die are still in the wafer, rather than after the relatively expensive packaging steps have been performed.

Increasingly, in IC processing, semiconductor wafers are subjected to a series of test and evaluation steps. For each step, the wafer is held in a stationary position at a process station where the process is performed. For many processes, it is important that the wafer be held extremely flat. For example, circuit testing is typically performed over a wide temperature range to temperature screen the ICs before assembly into a package. The wafer is typically held on a vacuum platform of a host test machine such as a probing station which electrically tests the circuits on the wafer. The prober includes a group of electrical probes which, in conjunction with a tester, apply predetermined electrical excitations to various predetermined portions of the circuits on the wafer and sense the circuits' responses to the excitations. To ensure that proper electrical contacts are made and to ensure that the mechanical load applied by the probes to the wafer is known and uniform, it is important to keep the wafer extremely flat.

In a typical prober system, the wafer is mounted on the top surface of a wafer chuck, which is held at its bottom surface to a support structure of the prober. A vacuum system is typically connected to the chuck. A series of channels or void regions in communication with the top surface of the chuck conduct the vacuum to the wafer to hold it in place on the top surface of the chuck. The prober support structure for the chuck is then used to locate the wafer under the probes as required to perform the electrical testing on the wafer circuits.

To allow for temperature screening of the wafer circuits, the chuck can also include a heater for heating the wafer to a desired temperature and a heat sink for cooling the wafer as needed. The prober system in conjunction with the chuck can then be used to analyze performance of the wafer circuits at various temperatures within a predetermined temperature range.

Conventional wafer chucks are formed from multiple components fastened together. For example, a typical chuck can include a lower plate or support for mounting to the prober, a heat sink over the lower plate, a heater over the heat sink and an upper plate or support assembly on which the wafer can be held, the upper plate including the vacuum channels used to conduct the vacuum to the top surface. In conventional chucks, all of these layers are typically held together by bolts, rivets, etc., or other rigid, inflexible mechanical fastening means. Furthermore, the chuck is typically held to the base of the host machine by similar rigid means.

These conventional means for holding the chuck together and holding the chuck to the base introduce mechanical stresses into the chuck structure. When the chuck is subjected to variations in temperature, these stresses tend to cause the chuck to deform, resulting in a loss of flatness of the wafer. The non-flat upper surface of the wafer can introduce inaccuracies into the circuit performance measurements performed by the prober.

The deformation in the chuck is typically caused by different chuck layers having different thermal expansion coefficients, such that, over temperature, different layers will experience different thermal expansion forces. Because the chuck layers are held together rigidly, the difference in forces causes the chuck to warp. As the chuck deforms, expansion forces build-up in the chuck. In most chucks, the clamping forces holding the layers together are sufficient to resist relative radial movement between the layers, and the warp increases. In some chucks, the clamping forces are such that, periodically, they are overcome by the expansion forces, and layers move rapidly in a jerking motion relative to each other to relieve the built-up stresses. This rapid "popping" motion is highly unpredictable and can introduce substantial wafer shape and/or location errors. Also, because the clamping forces are so high in these systems, the chuck layers are not relieved all the way back to a zero-expansion condition. So, in general, there is always some undetermined amount of deformation in the chuck over temperature.

It will be appreciated that these effects caused by the conventional mechanically constrained chuck assembly are magnified for larger diameter chucks. That is, the stresses introduced in clamping or bolting together a large diameter chuck are greater than those introduced in assembling a small diameter chuck. Larger chucks therefore tend to deform more over temperature than do smaller chucks. Therefore, using conventional wafer chuck techniques, it is becoming increasingly more difficult to hold wafers flat over temperature as wafer diameters continue to increase.

Conventional wafer chucks used for temperature cycling are typically mounted on the prober support structure in a manner which provides for good thermal conduction between the chuck and the prober support structure. In these systems, large amounts of energy dedicated to temperature cycling of the wafer can be lost in the form of heat flow between the prober and the chuck. Also, temperature variations in the prober support structure can cause spatial shifts in the wafer which can cause inaccuracies in the prober circuit testing.

OBJECTS OF THE INVENTION

It is an object of the invention to provide a workpiece chuck in which the foregoing disadvantages of prior devices are substantially eliminated.

It is a more specific object of the invention to provide a workpiece chuck for supporting a workpiece which maintains the workpiece substantially flat over a wide range of temperature variations.

It is another object of the invention to provide a workpiece chuck which is held together in a stiff but mechanically non-constrained fashion such that thermal and mechanical stresses in the chuck are reduced.

It is another object of the invention to provide a workpiece chuck which is held to the support structure of a host machine such as a wafer prober machine by a stiff but mechanically non-constrained means, such as vacuum or springs.

It is still another object of the invention to provide a workpiece chuck on which large-diameter semiconductor wafers can be supported and maintained flat during electrical probe testing over a wide range of temperatures.

It is yet another object of the invention to provide a workpiece chuck for supporting a semiconductor wafer, the workpiece chuck being mountable on a base and including means for heating and cooling the semiconductor wafer while maintaining the base at or near an ambient temperature.

It is yet another object of the invention to provide a workpiece chuck for supporting a semiconductor wafer and mountable on a base and including means for heating and cooling the semiconductor wafer, the workpiece chuck providing thermal isolation between the workpiece chuck and the base such that the workpiece chuck exhibits improved energy efficiency.

SUMMARY OF THE INVENTION

These and other objects of the invention are realized by a chuck apparatus and method for holding a workpiece in accordance with the invention. The chuck of the invention includes an upper support or assembly on which the workpiece or wafer can be mounted and a lower support or assembly by which the chuck can be mounted to a base such as the support structure of a host machine such as a circuit prober. In general, the upper support is characterized by a first temperature and the lower support is characterized by a second temperature. The chuck also includes non-constraining attachment means which holds the upper and lower supports together and holds the lower support and the base together while allowing substantially continuous relative movement between layers of the chuck caused by thermal expansion forces due to differential temperature effects between the upper support, lower support and the base. By using non-constraining attachment means, such as vacuum or springs or spring washers such as belleville washers which are not clamped with sufficient force to completely constrain the chuck layers against radial movement relative to each other, the mechanical stresses found in the rigidly assembled chucks of prior systems are eliminated. The relative movement between layers is substantially continuous in that the rapid jerking or popping motion of prior systems is eliminated by using the non-constraining attachment means.

In one embodiment, the upper assembly can include a substrate made of an insulating material. In one particular embodiment, the insulating material is a ceramic. Where vacuum wafer attachment is used, the substrate can be formed with a vacuum distribution pattern on its top surface for holding the wafer in place. The substrate can be provided with one or more vacuum ports for applying the vacuum to the upper assembly and can include inner channels or void regions connecting the vacuum ports with the pattern on the top surface, or it can be provided with holes through the substrate and metallic surfaces, if any, above and below the substrate to vacuum ports in a lower support or assembly.

The vacuum distribution pattern on the top surface can be a "waffle" pattern which includes a rectangular array of raised rectangular regions separated by narrow channels along the surface through which the vacuum is distributed to hold down the wafer. In this configuration, the bottom surface of the wafer rests on the top surfaces of the raised rectangular regions.

The vacuum distribution pattern on the top surface can be formed on the top surface by one of several processes. In one approach, the pattern of channels or "streets" is ground into the ceramic substrate and may then be coated with a layer of metal if electrical contact to the back side of the wafer is desired. In another embodiment, a uniform layer of metal is deposited onto the top surface of the substrate, and then a pattern of channels is etched into the metal, leaving a pattern of raised rectangular metallic pads. In another embodiment, the raised regions are formed by depositing the array of rectangular metallic pads onto the ceramic substrate, leaving the channels between the pads. To provide electrical conduction between the chuck and the wafer, a thin layer of metal can be added on top of the patterned vacuum distribution layer. Any of the metallic layers can be deposited by a silk screening process, or other process such as plating, sputtering, brazing, etc., or a combination thereof.

During circuit testing, to improve the sensitivity of a measurement, it is sometimes desirable to reduce electrical current leakage between the wafer under test and ground. To that end, the substrate in the chuck of the invention can include a guard layer contacting its bottom surface. The guard layer is a layer of metal contacting the bottom surface of the substrate and connected to a terminal to allow for external electrical access. To reduce leakage or capacitance effects in the substrate, a signal approximately identical to the excitation signal being applied to the circuit under test is applied to the guard layer. By thus maintaining the upper and lower surfaces of the substrate at the same potential, leakage currents through the substrate are substantially reduced or eliminated. The guard layer includes an insulating surface below it which permits a signal approximately identical to the excitation signal being applied to the circuit under test to be applied to the guard layer.

Where the upper and lower assemblies are held together by vacuum, the bottom surface of the upper assembly can be formed with another vacuum distribution pattern which may be produced by any of the means by which vacuum patterns can be formed on the top surface of the substrate. The pattern can define plural concentric raised portions with concentric annular vacuum distribution regions between them. The guard layer can be held together with the upper assembly by this lower vacuum distribution pattern in the upper assembly or by a vacuum pattern in the guard layer itself.

The lower assembly can include a heater and a heat sink for heating and cooling the wafer. In one embodiment, the heat sink is located above the heater and, hence, closer to the wafer to provide more efficient heat flow into the heat sink during cooling. The heater can be attached to the bottom surface of the heat sink by one of many techniques, one of which is to directly vulcanize it to the heat sink, another of which involves bonding the heater to the heat sink using epoxy. The heat sink can include tubing through which fluid flows. The tubing can be formed as a spiral intake with a reverse spiral outlet, with intake tubing adjacent to outlet tubing to provide efficient and uniform removal of heat from the heat sink. In one embodiment, fluid can also flow through the bottom of the lower assembly to maintain an ambient temperature barrier between the chuck and the base to prevent heat flow between the chuck and the base.

The upper and lower assemblies can be aligned with each other by one or more alignment pins. In one embodiment, the alignment pins are pressed into the lower assembly and protrude through the top surface of the lower assembly. When the upper and lower assemblies are brought together, the alignment pins mate with alignment holes in the bottom surface of the upper assembly. In one embodiment, one of the alignment holes, which can be located at the center of the chuck, is round and is sized to provide a slip fit with its associated alignment pin. Another hole can be elongated to provide a slip fit with a pin in one direction and to allow motion of the pin in the orthogonal radial direction. This configuration allows for relative expansion and contraction of parts while preventing relative rotation.

The present invention provides thermal isolation between the chuck and the base while also providing adequate mechanical support for the mechanical load on the wafer, such as that due to forces exerted by the probes or probe array of the prober. The lower assembly includes a lower support plate to which the heat sink can be mounted. The heat sink can rest on a plurality of thermally insulating elements located between the bottom of the heat sink and the top of the lower support plate. The elements can be in the shape of posts, rods, cylinders or spherical balls in any spatial orientation including upright or lying down, and can be made of a thermally insulating material such as glass, ceramic, etc. The elements provide thermal isolation and mechanical support within the lower assembly of the chuck. The number of elements and their locations can be selected based on a desired chuck stiffness. For reasonable stiffness of larger diameter chucks, more than three elements, which are sufficient to define a plane, can be used. For this reason, a plurality of elements which have very close-toleranced heights can be used.

The bottom of the heat sink can also be equipped with a vacuum seal such that the chuck can be vacuum mounted to the base. A ring can be mounted to the bottom of the heat sink. The ring can include the required seal, e.g., o-rings, to seal the bottom of the chuck to the base. The ring can also include openings through which additional rods can pass to support the chuck on the base while also providing thermal isolation.

A temperature control system that can be used to control temperature of the chuck and workpiece in accordance with the present invention is described in a copending U.S. patent application entitled "Temperature Control System for a Workpiece Chuck," filed on even date herewith and assigned to the same assignee as the present application. The electrical control system used in connection with the chuck of the present invention is described in a copending U.S. patent application entitled "Power and Control System for a Workpiece Chuck," filed on even date herewith and assigned to the same assignee as the present application. Both of those copending patent applications are incorporated herein in their entirety by reference.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE DRAWINGS

Figure 1:
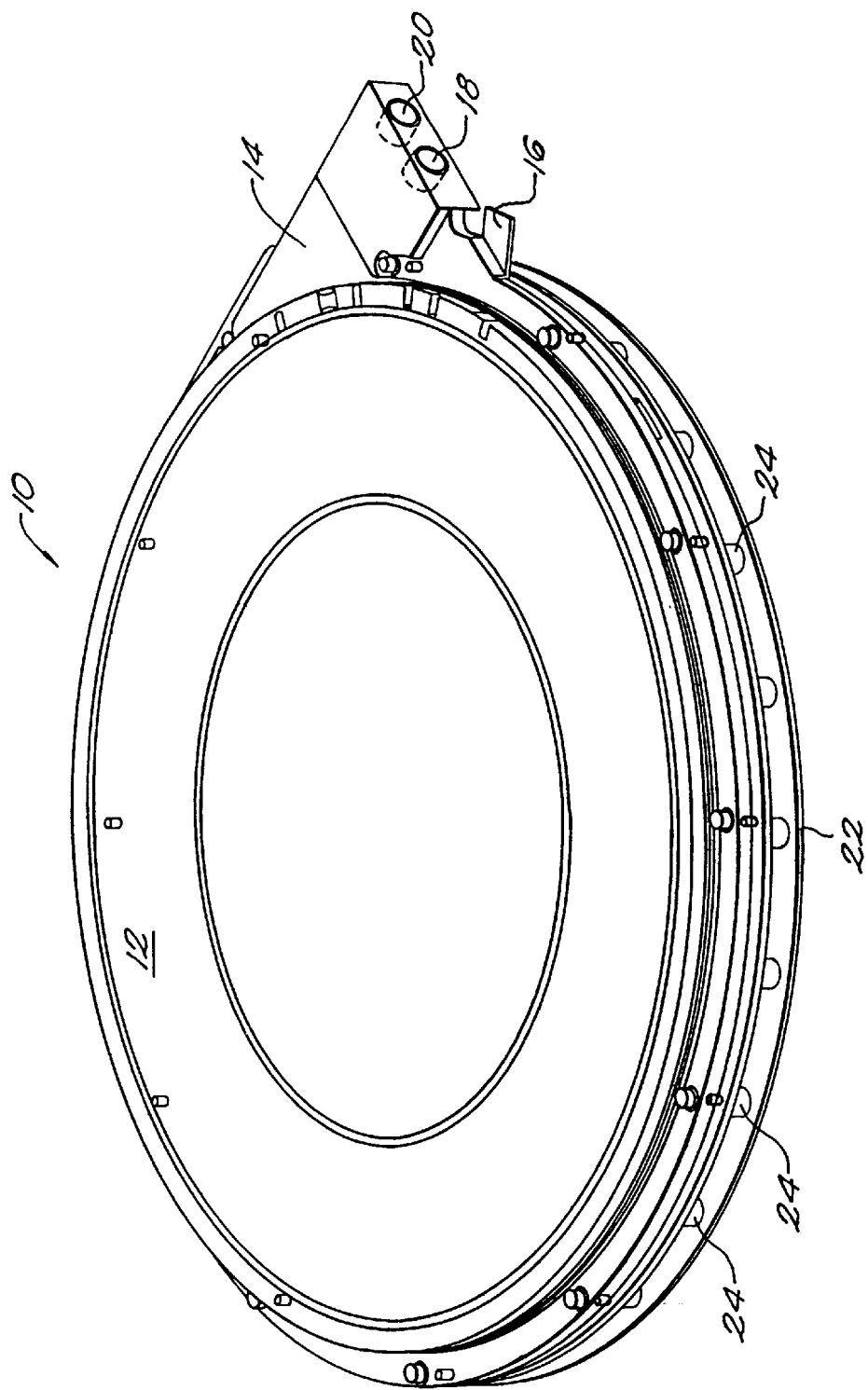
FIG. 1 is a schematic perspective view of one embodiment of a workpiece chuck in accordance with the present invention.

FIG. 1 is a schematic perspective view of one embodiment of the workpiece chuck 10 of the invention. The chuck 10 includes a top surface 12 on which a semiconductor wafer can be mounted. In one embodiment, the top surface 12 is formed with a vacuum distribution pattern as described below to distribute vacuum along the bottom surface of the wafer and thus hold the wafer to the chuck 10. The chuck 10 also includes a heat sink 14 used to remove heat from the wafer being processed. Ports 18 and 20 allow for circulation of a cooling fluid within the heat sink 14. The chuck 10 also includes a heater 16 attached to the bottom surface of the heat sink 14. As described below in detail, the chuck 10 also includes a lower insulating plate 22 over a base 48 which can be mounted to a host machine such as a prober machine. The components of the chuck 10 are mechanically supported over the support plate 22 by a plurality of thermally insulating supporting elements such as rods 24 which can be made of glass or other insulating material.

The chuck 10 is held together by some non-constraining attachment means described below in detail which provides clamping force sufficient to hold the chuck together during accelerations introduced by the host machine during positioning of the chuck 10. At the same time, the attachment means holds the chuck in a non-constraining fashion such that lateral forces due to thermal expansion effects can overcome the clamping forces such that layers of the chuck 10 can move substantially continuously relative to each other under thermal expansion forces.

Figure 2:
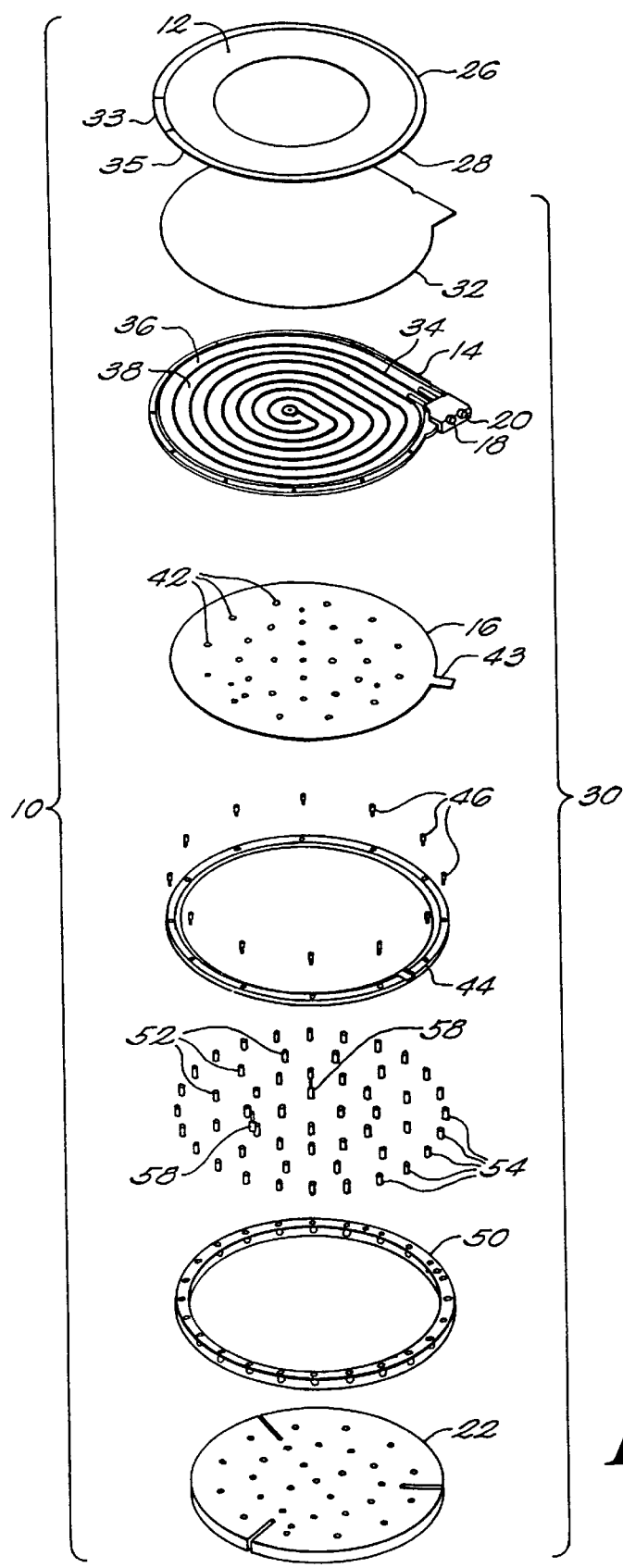
FIG. 2 is a schematic exploded view of one embodiment of the chuck of the invention using vacuum to hold the chuck together.
Figure 3:
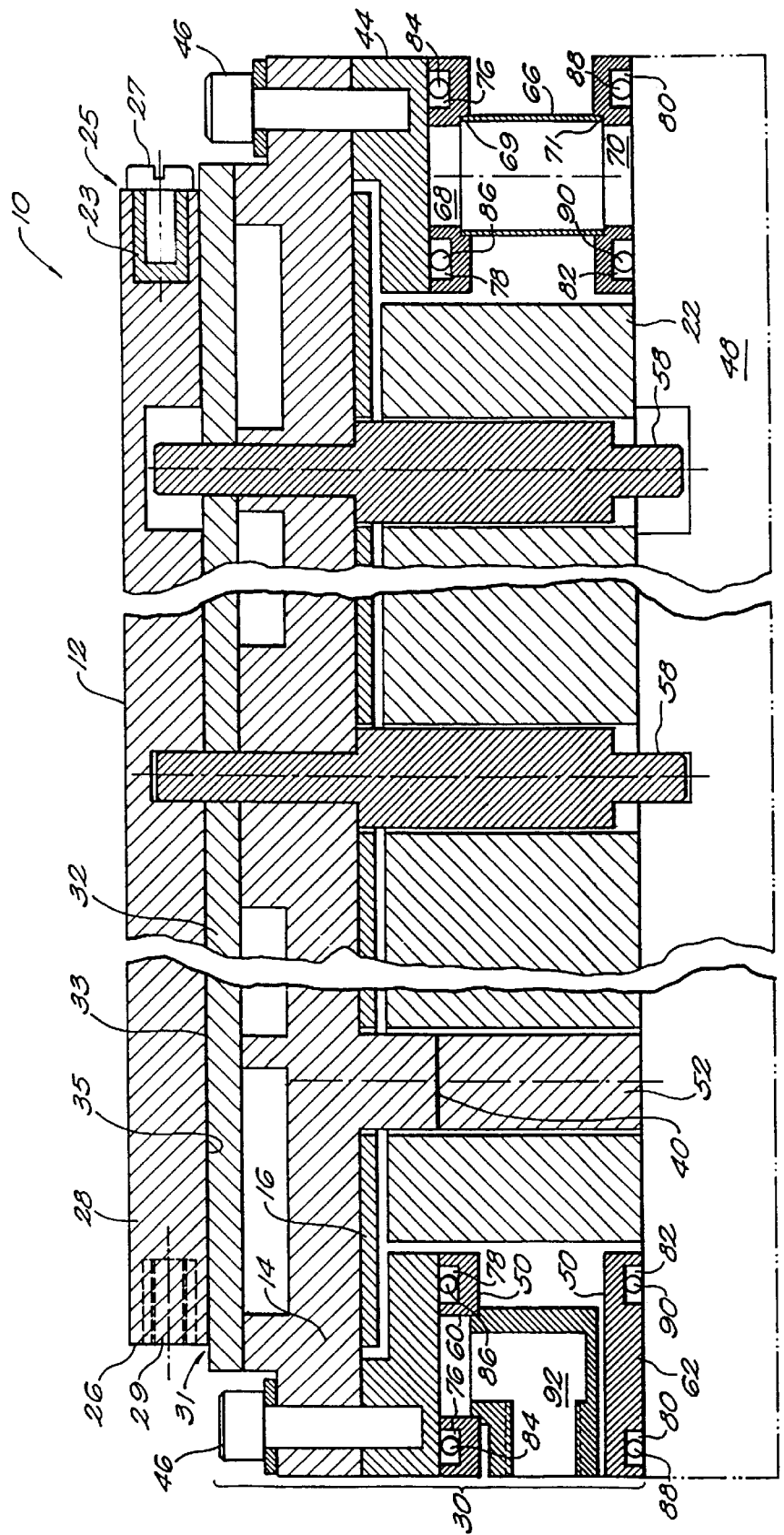
FIG. 3 is a schematic cross-sectional view of the chuck of FIG. 2 using vacuum to hold the chuck together.

FIG. 2 is a schematic exploded view of one embodiment of the workpiece chuck 10 of the invention using vacuum to hold the chuck together, and FIG. 3 is a schematic cross-sectional view of the chuck 10 of FIG. 2. Referring to FIGS. 2 and 3, the chuck 10 includes an upper assembly or support 26 which includes the patterned top surface 12 which includes a vacuum distribution pattern for distributing vacuum to the bottom surface of the wafer to hold the wafer to the chuck. The top surface 12 is formed over an insulating substrate 28 which can be formed from a ceramic material such as aluminum nitride, alumina or similar material. A top metallization layer can be formed over the vacuum distribution pattern to allow for good electrical contact between the wafer under test and the chuck 10. The metallization layer can be sputtered onto the top surface and over a side of the substrate 28 such as at 25. Electrical connection can be made to the metallization layer, for example, with a wire and lug fastened by a screw or stud 27 inserted into hole 23 and contacting the metal along the side of the assembly 26. Because in this embodiment the upper assembly is attached to lower chuck components by vacuum, the bottom surface of the ceramic substrate 28 can also be formed with a vacuum distribution pattern.

A metallic layer 33 can be placed in contact with the bottom surface of the substrate. When this metallic layer has an insulating layer 35 on its underside, the metallic layer forms a conductive guard used to eliminate capacitively coupled noise effects during testing. A signal substantially identical to the excitation signal being used to test a circuit is also applied to the guard. By keeping the wafer and the guard at the same potential, leakage through the substrate 28 is reduced. Connection can be made to the guard 33 by forming a portion of the guard 33 along the side of the substrate such as at 31. A conductive element can be attached to the guard by directly brazing it or by inserting a stud or connector into a hole 29 in the substrate 28 to make contact. If a guard layer is inserted, an insulation layer 35 would be formed under the guard layer to prevent electrical conduction into the lower components of the chuck 10. In other embodiments the guard 33 would be omitted.

The remaining components in FIGS. 2 and 3 form a lower assembly or lower support 30 of the chuck 10. The lower assembly 30 includes the heat sink 14 which is covered by a thermally conductive cap 32 made of a material such as aluminum or copper or other conductive material suitable to the temperature range of operation. The cap 32 can be attached to the top of the heat sink 14 by oven brazing or other attachment process.

The heat sink 14 can include a pair of channels which carry fluid in a spiral fashion through the heat sink. An inlet channel 36 receives the fluid from the inlet port 20 and an outlet channel 38 carries the fluid out of the heat sink 14 via the outlet port 18. The channels are separated by a wall 34, which, when the cap 32 is attached to the top of the heat sink 14, separates the channels 36 and 38. Fluid entering the heat sink 14 is carried in a spiral fashion into a central region at the center of the heat sink 14 and then into the outlet channel 38 which returns the fluid to the outlet port 18.

The maximum temperature differential between inlet fluid and outlet fluid occurs at the ports 18 and 20. The return-spiral configuration spreads the total temperature differential such that the temperature is maintained more uniform across the wafer than it would be if the cooling fluid were removed at the center of the spiral. That is, if the fluid were removed at the center of the heat sink, then the entire temperature differential would be applied across the wafer from its edge to its center. In the present invention, the temperature differential between inlet and return is maintained where the channels are adjacent to each other, with the lowest differential existing where the adjacent channels intersect at the center of the heat sink and the highest differential existing where the channels connect to the ports 18 and 20.

The bottom surface of the heat sink 14 can be formed with a plurality of studs or pegs 40 which can be used to support the heat sink. The lower assembly 30 of the chuck 10 can also include a heater 16 attached to the bottom of the heat sink 14. The heater 16 is formed with a pattern of clearance holes 42 which allow the studs 40 to pass through the heater 16 when the heater 16 and heat sink 14 are attached to each other. The heater can be a resistive foil heater and it can be adhered to the bottom surface of the heat sink 14 such as by a vulcanizing process or by epoxy bonding. The electrical connection is made to the heater 16 via a tab 43 which protrudes out of the chuck from the edge of the heater.

Adhering the heater 16 to the heat sink 14 provides intimate contact between them such that heat can be quickly and efficiently conducted through the conductive body of the heat sink 14 and its conductive cap 32 up to the workpiece. The vulcanization process involves applying an adhesive to the heat sink 14 and/or heater 16 and attaching the two using the adhesive. Next, the attached heater and heat sink are subjected to heating under pressure to cure the adhesive. The result is good thermal conduction between the heater 16 and the heat sink 14.

The lower support assembly 30 can also include an upper vacuum platform ring 44 which can be attached by bolts 46 to the bottom of the heat sink 14 around the circumference of the heat sink 14 as shown. The upper vacuum platform ring 44 is used in conjunction with a lower vacuum attachment ring 50 as part of a vacuum attachment assembly which attaches the chuck 10 to its base or to a base which is a part of the apparatus on which the wafer is to be processed, e.g., the prober's chuck support structure top, which is shown in FIG. 3 in phantom and indicated by reference numeral 48. This vacuum attachment assembly will be described below in detail.

As mentioned above, the lower surface of the heat sink 14 can be formed with a plurality of support pegs or studs 40 which support the chuck 10 on the base 48. This base 48 can be either a bottom portion of the chuck 10 or a support structure that is part of the host apparatus, i.e., the prober. To provide the required mechanical support and simultaneously thermally isolate the chuck 10 from the host machine, the heat sink studs 40 rest on a matching plurality of thermally nonconductive elements 24 shown in FIGS. 2 and 3 in the form of upright posts, studs or rods. In one embodiment, these elements 24 are made of a thermally insulating material such as ceramic or glass. The thermally insulating support elements 24 can be of any suitable shape, such as cylinders, spherical balls or the rods shown and described herein. They can also be in any suitable orientation, e.g., upright, laying down, etc. The embodiment described herein uses rods in an upright position, but other shapes and orientations can be used. It should be noted that the elements shown in FIG. 2 include two sets of glass rods. One set of rods 52 is located under the studs 40 formed in the heat sink 14 as described herein. The second set of glass rods 54 shown in FIG. 2 is disposed in a ring surrounding the first set. This second set is used in the vacuum attachment assembly as described below to support the heat sink at its circumference on the base 48.

The lower support assembly 30 also includes one or more alignment pins 58 for aligning the upper support assembly 26 and lower support assembly 30 when they are assembled together. The alignment pins 58 can be press fit into the heat sink 14 and its cap 32. The pins can be slip fit into alignment holes in the upper assembly 26 and in the base 48. In one embodiment, two alignment pins 58 are used. The upper assembly 26 and base 48 each include a circular hole which receives an end of one of the pins. The opposite ends of the other pin are received in alignment slots in the upper assembly 26 and the 48 base which allow the relative positions of the base and chuck to be adjusted. That is, the relative positions can change to accommodate relative radial expansion and contraction. However, relative rotation is prevented as is movement between centers.

The lower support assembly 30 also includes a lower insulation plate 22 between the heat sink/heater combination and the base 48. The lower plate 22 provides additional thermal insulation and can be formed with a plurality of clearance holes for the thermally insulating elements 52 and the alignment pins 58. The lower base 48 can also include means for circulating fluid through the base 48 to cool or control the temperature of the base 48. This establishes a thermal barrier between the chuck and the base to prevent heat flow between the chuck and the prober support structure.

As described above, the lower assembly 30 can also include a vacuum attachment assembly for attaching the chuck 10 to the base 48 and supporting the chuck 10 on the base 48. The vacuum attachment assembly includes the upper vacuum platform ring 44 and the lower vacuum attachment ring 50. The lower ring 50 includes two annular rings 60 and 62 opposed to each other and spaced apart from each other by a plurality of thin-walled, insulating tubes 66 which can be formed of a low-thermally-conducting metal such as stainless steel. In one embodiment, twenty-four tubes evenly spaced around the rings 60 and 62 are located coaxially with twenty-four holes 68 in ring 60 and twenty-four aligned holes 70 in ring 62. Each of the holes 68 and 70 includes a counterbore 69 and 71, respectively, in which an end of a tube 66 is located. The tubes 66 are attached in position by oven brazing, soldering or similar process to assemble the two rings 60 and 62.

Each of the rings 60, 62 includes a pair of annular channels formed on opposite sides of the ring of holes 68, 70. The ring 60 includes two annular channels 76 and 78 on opposite sides of holes 68, and ring 62 includes channels 80 and 82 on opposite sides of holes 70. Each channel has inserted therein an o-ring for providing a vacuum seal for its respective ring 60, 62. Specifically, channels 76 and 78 include o-rings 84 and 86, respectively, for sealing ring 60 to the bottom surface of the upper vacuum platform ring 44. Channels 80 and 82 include 0-rings 88 and 90, respectively, for sealing ring 62 to the base 48. The lower vacuum attachment ring 50 also includes a vacuum port 92 for applying a vacuum to the vacuum attachment assembly to hold the chuck 10 to the base 48. When the vacuum is applied at the vacuum port 92, the lower support assembly 30 is held to the base 48.

As noted above, a second set of rods 54 of a thermally insulating material such as ceramic or glass are used as part of the vacuum attachment assembly to support the chuck 10 on the base 48. Each of the rods 54 is located within an associated pair of holes 68, 70 and stainless steel tube 66. When the vacuum is applied, the surface of the upper vacuum platform ring 44 and the base 48 are pulled against the rods 54 between them. The o-rings 84, 86, 88 and 90 provide the vacuum seal that permits attachment and the rods provide the mechanical support.

Figure 4:
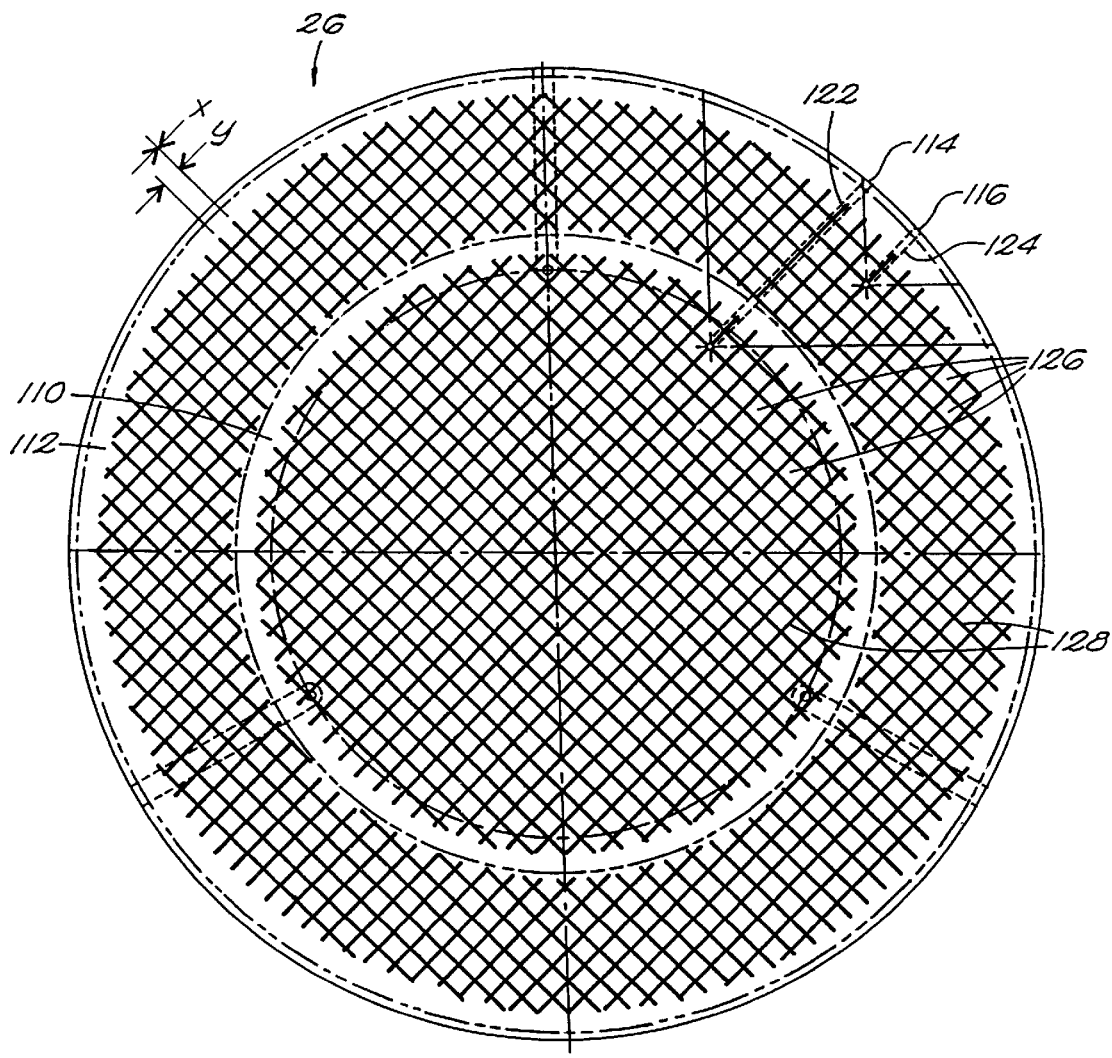
FIG. 4 is a schematic diagram of the top surface of the chuck of the invention showing a vacuum distribution pattern used to hold a flat workpiece.

FIG. 4 is a schematic plan view of the upper assembly 26 of the chuck 10 of the invention showing one embodiment of the vacuum distribution pattern on the top surface 12 of the chuck 10. As shown, the pattern actually can include two patterns, an inner pattern 110 and an outer pattern 112, each with its own vacuum connection port 114 and 116, respectively. The ports 114 and 116 are connected by channels 122 and 124, respectively, to vacuum patterns 110 and 112, respectively. The inner and outer patterns allow the chuck 10 to accommodate wafers of different diameters. For example, in one embodiment, the chuck 10 may be used for either eight-inch wafers or twelve-inch wafers. When an eight-inch wafer is used, vacuum is supplied through port 114 only to activate only the inner vacuum pattern 110. When a twelve-inch wafer is used, vacuum is supplied to both vacuum ports 114 and 116 to activate both vacuum patterns 110 and 112.

Each vacuum pattern 110, 112 can include a rectangular grid of raised rectangular regions 126 separated by channels or grooves 128. A wafer being held to the chuck rests on the raised rectangular regions 126 while vacuum within the channels 128 holds the wafer down. The width of a channel 128 is represented in FIG. 4 as x, and the distance between channels is represented as y. In one embodiment, x=0.025 inch and y=0.250 inch. In another embodiment, x=0.050 inch and y=0.100 inch. Many other dimensions can be used.

The vacuum patterns can be formed by one of several possible approaches. In one embodiment, the patterns are formed by grinding the channels 128 into the surface of the substrate, leaving the raised regions 126 between them. The surface can then be coated with a conductive metallic material. In another embodiment, a uniform layer of metal is deposited onto the top surface of the substrate, and then the pattern of channels is etched into the metal, leaving a pattern of raised rectangular metallic pads. In another embodiment, the raised regions are formed by depositing the array of rectangular metallic pads onto the ceramic substrate, leaving the channels between the pads. To provide electrical conduction between the chuck and the wafer, a thin layer of metal can be added on top of the patterned vacuum distribution layer. Any of the metallic layers can be deposited by a process such as silk screening, plating, sputtering or brazing.

Figure 5:
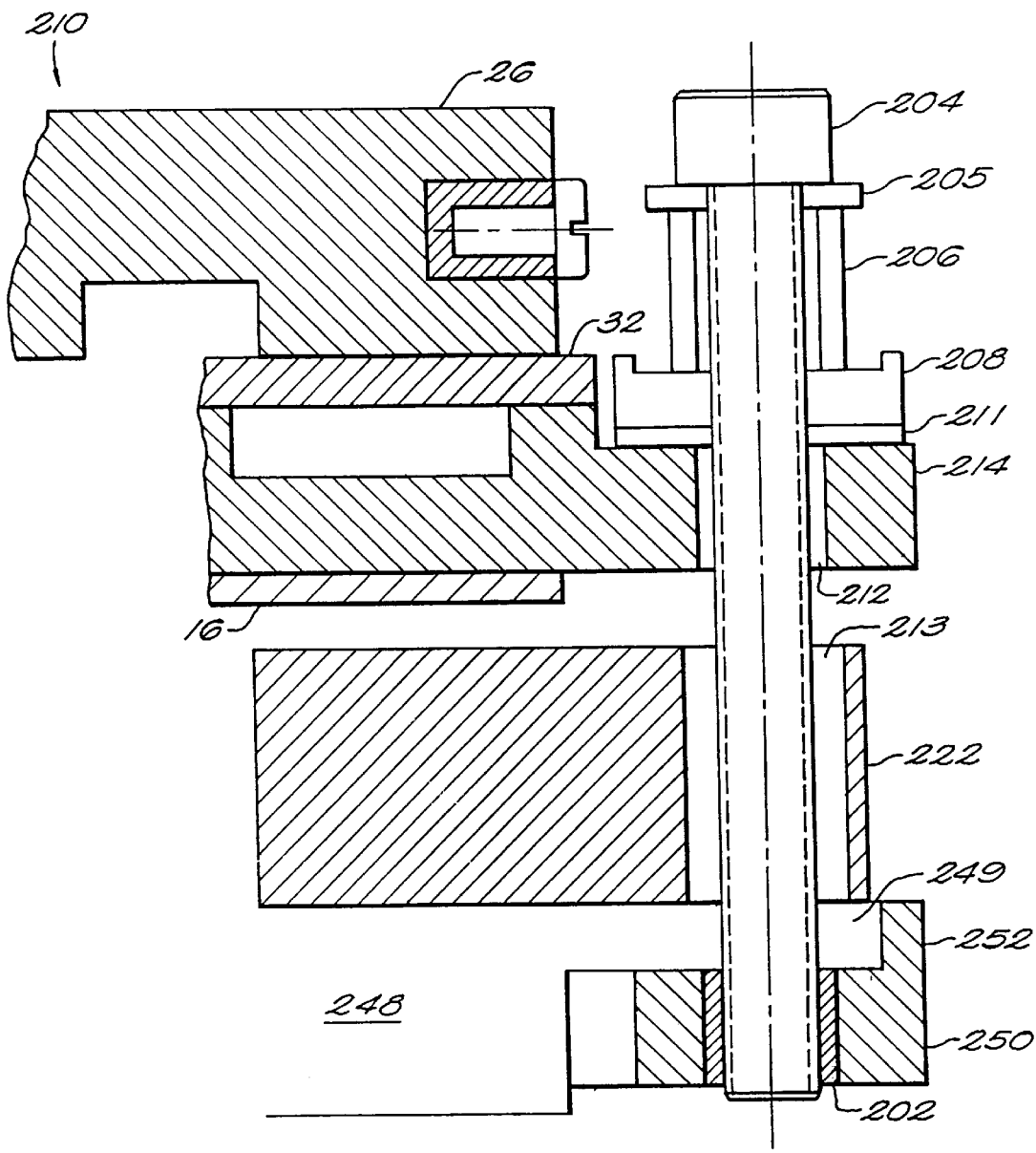
FIG. 5 is a schematic partial cross-sectional view of an alternative embodiment of the workpiece chuck of the invention using springs to hold the chuck together.

As mentioned above, the upper and lower supports or assemblies of the invention can also be held together by spring force. FIG. 5 is a partial schematic cross-sectional view of an alternative embodiment 210 of the chuck of the invention using springs to hold the chuck together. FIG. 5 shows only the portions of the chuck 210 required for the description of the alternative embodiment of the invention. It will be understood that other elements of the chuck 210 are similar to the corresponding elements described in detail above in connection with FIGS. 2 and 3.

The chuck 210 includes the upper support or assembly 26 held by vacuum to the conductive cap 32 on the heat sink 214. The heater 16 is intimately attached to the bottom of the heat sink 214 by some intimate attachment means such as adherence by vulcanization or epoxy bonding. The chuck 210 is mounted to a host machine by a base 248, and a lower support plate 222 is disposed between the base 248 and the upper portions of the chuck 210.

The base 248 includes an annular flange 249 which forms the circumferential edge of the base 248. A lower mounting ring 250 is located under the flange 249. A bolt 204 holds the lower assembly of chuck 210 together. The bolt 204 extends through oversized clearance holes 212 and 213 in the heat sink 214 and lower support plate 222, respectively, and is threaded into a threaded hole 202 in the lower mounting ring 250.

The lower assembly of chuck 210 is held together by spring force which is provided by a partially compressed coil spring 206 captured between a flat washer 205 and a capturing cup element 208. A TEFLON® washer 211 is provided between the cup element 208 and the heat sink 214 to allow the chuck parts to slide relative to each other in response to differential temperature effects and to provide thermal insulation between the heat sink 214 and base 248. The oversized clearance holes are also provided to allow the chuck parts to move relative to each other and for thermal isolation. Thus, chuck and workpiece distortions due to differential temperature effects are substantially eliminated.

Figure 6:
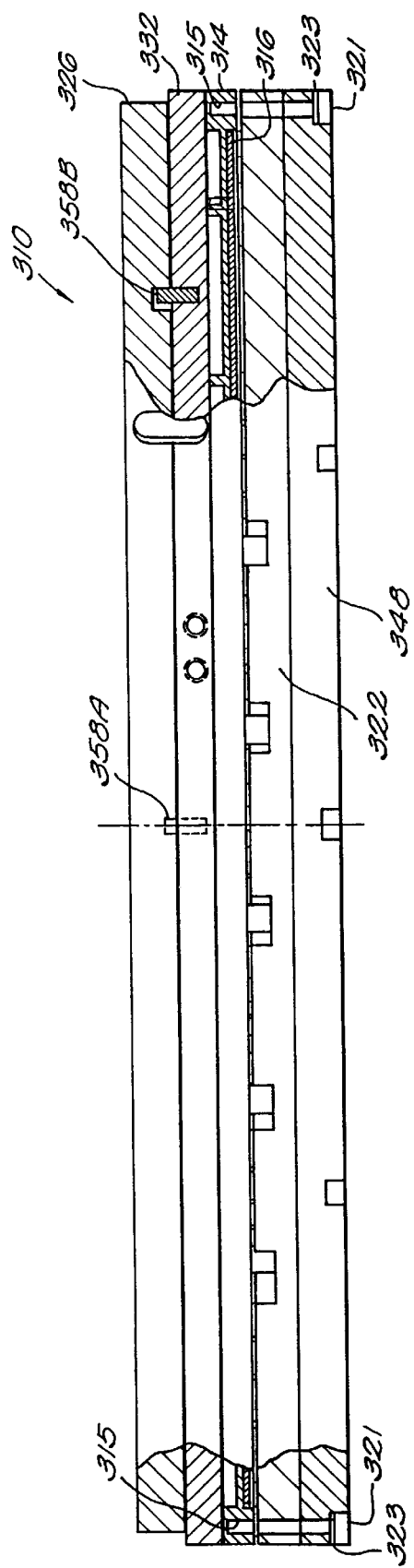
FIG. 6 is a schematic partial cross-sectional view of another alternative embodiment of the workpiece chuck of the invention.

FIG. 6 is a schematic partial cross-sectional view of another alternative embodiment 310 of the workpiece chuck of the invention. This embodiment of the chuck 310 includes a top assembly 326 mounted over a heat sink 314 which is covered by a conductive cap or cover 332 secured to the heat sink 314 by brazing or other known process. The heater 316 is adhered to the bottom of the heat sink 314 by some process such as vulcanization or epoxy bonding. The heat sink 314 and heater 316 are mounted over a support plate 322 which is mounted on the base 348. Two alignment pins 358A and 358B are attached to the cap 332 by press fit into corresponding holes or by brazing or other attachment process. Free ends of the alignment pins 358A and 358B protrude into alignment holes in the upper assembly 326. The central alignment hole, which receives pin 358A, can be circular to provide a slip fit with the free end of the alignment pin 358A. The other hole, which receives alignment pin 358B, can be elongated to allow for radial movement caused by differential temperature effects while preventing rotation between parts of the chuck 310.

In this embodiment, the base 348 can be attached to the heat sink 314 by bolts 321 which are secured in threaded holes 315 in the heat sink 314. To provide non-constraining attachment in accordance with the present invention, a resilient spring-type washer 323 can be used with each bolt 321. In one embodiment, the resilient or spring washer 323 is a belleville washer. The torque applied to the bolts 321 to tighten them is sufficient to partially compress the washers 323 such that sufficient force is applied to hold the chuck together under expected accelerations. However, the applied torque is also low enough such that the forces holding the chuck 310 together can be overcome by expansion forces caused by thermal effects. As a result, the chuck layers can move relative to each other in a substantially continuous fashion under thermal expansion forces while being held together against accelerations. The base 348 can be bolted to the host machine to hold the chuck 310 on the prober support structure.

Figure 7:
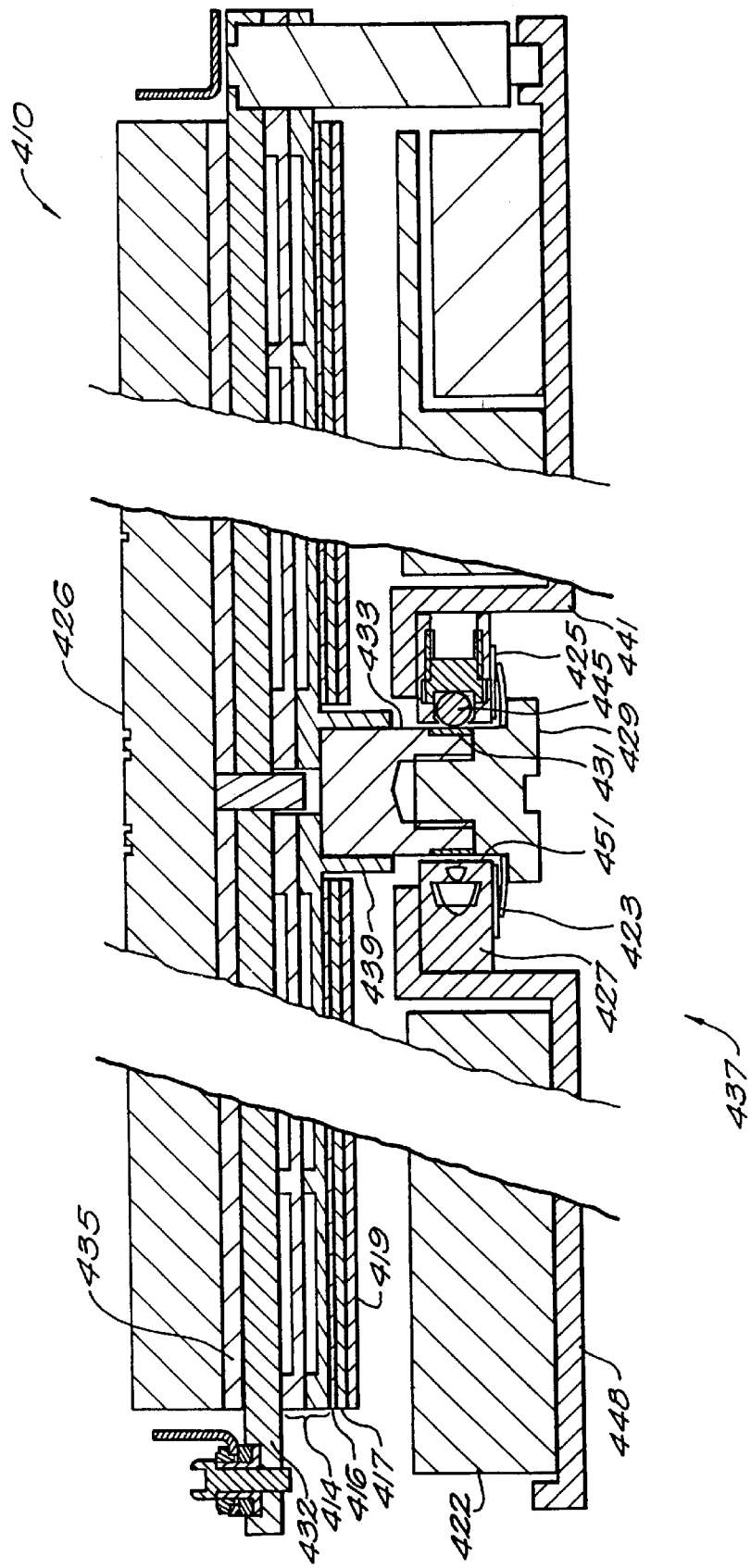
FIG. 7 is a schematic cross-sectional view of another alternative embodiment of the workpiece chuck of the invention.

FIG. 7 is a schematic cross-sectional diagram of another alternative embodiment 410 of the chuck of the invention. The chuck 410 includes a top assembly 426 which is mounted over an insulation layer 435. A heat sink 414 is covered by a conductive upper cap 432 which is attached by brazing or other process. A resilient, compressible (spring-like) insulating paper 417 is applied to the bottom of the heater 416, and a metallic backing plate 419, made of a material such as stainless steel, is attached to the bottom of the resilient paper 417 by screws (not shown) which pass through the paper 417 and the backing plate 419 and thread into the heat sink 414, thus attaching the heater 416 to the bottom surface of the heat sink 414. The upper components of the chuck 410 are mounted over the lower support plate 422 and the base 448, which can be attached to the host machine by bolts (not shown).

Figure 8:
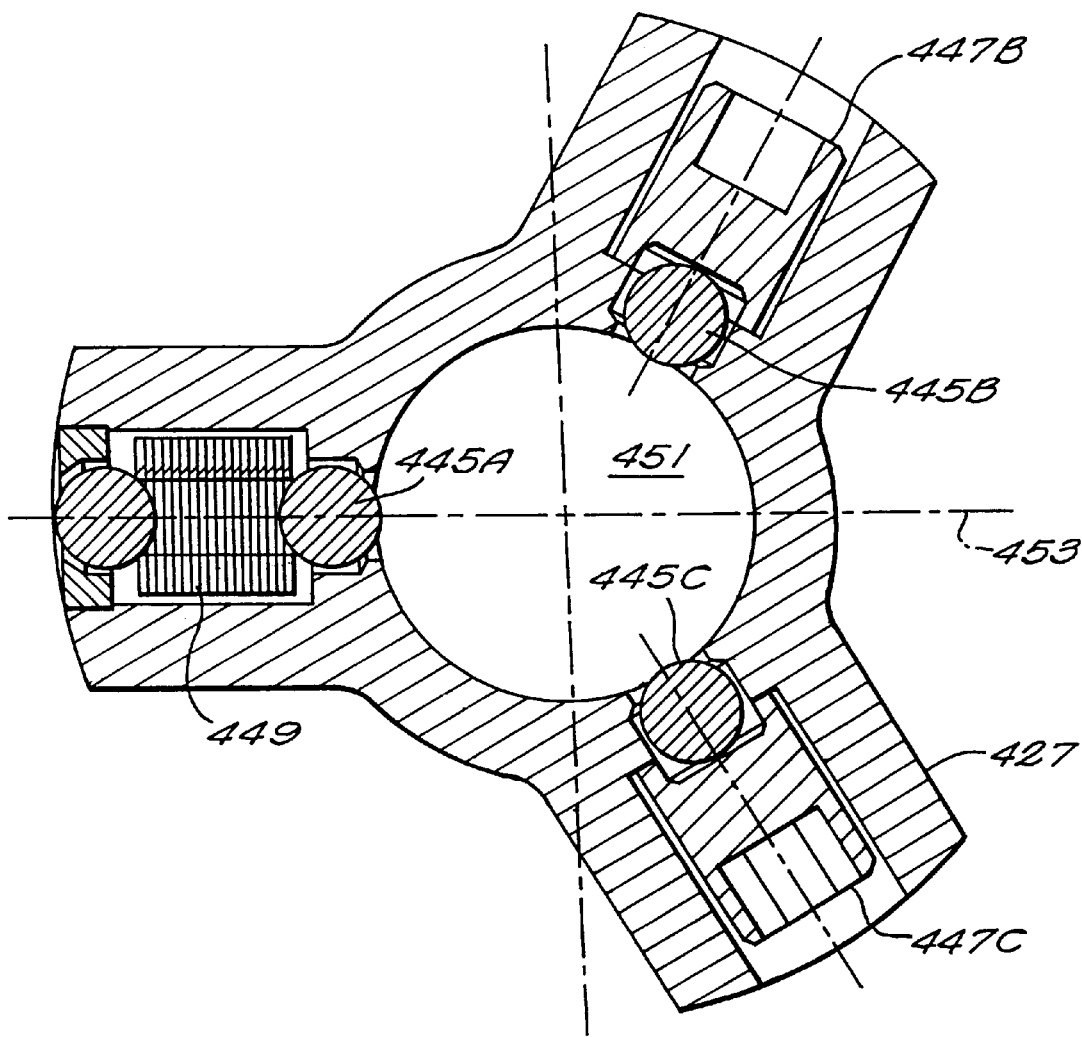
FIG. 8 is a schematic cross-section of a three-point attachment member in accordance with the present invention.

The upper portion of the chuck 410 is attached to the base 448 by an attachment mechanism 437. The attachment mechanism 437 includes a boss 439 which is integrally formed as part of the bottom of the heat sink 414. An insert 433 is fixedly mounted such as by brazing in the inside of the boss 439. A three-point attachment member 427, as detailed in FIG. 8, is fixedly mounted in a recess 441 in the base 448. The three-point member 427 includes a hole 451 which provides clearance for the insert 433 when the chuck 410 is assembled. A threaded screw 429 is threaded into threaded hole 431 in the insert 433. The screw 429 provides attachment force against a resilient washer 423 which can be a belleville washer. The resilient washer 423 is mounted over a flat washer 425, which can be made of an insulating material such as a ceramic to reduce heat flow between the chuck 410 and the prober machine. The screw 429 is tightened such that spring force provided by the spring washer 423 is applied to hold the upper portion of the chuck 410 to the base 448. The three-point attachment member 427 and the spring attachment using the screw 429 and resilient washer 423 provide sufficient force to hold the chuck 410 together on the base 448 under accelerations due to positioning motions while allowing relative movement between the base 448 and the upper portion of the chuck 410 caused by thermal expansion forces such that distortions caused by differential temperature effects are substantially eliminated.

FIG. 8 is a schematic detailed cross-sectional view of the three-point attachment member 427. The attachment member includes two stationary spherical contact balls 445B and 445C which contact the insert 433 when the chuck 410 is assembled. The stationary balls 445B and 445C are held in stationary position by adjustable set screws 447B and 447C, respectively. Spherical ball 445A is moveable against coil spring 449 such that motion along the axis 453 is permitted such that chuck layers can move relative to each other under thermal expansion forces.

While this invention has been particularly shown and described with references to preferred embodiments thereof, it will be understood by those skilled in the art that various changes in form and details may be made therein without departing from the spirit and scope of the invention as defined in the following claims.

What is claimed is:

1. A chuck for supporting a workpiece comprising:
an upper support for mounting the workpiece, said upper support being characterized by a first temperature;
a lower support for mounting the chuck to a base, said lower support being characterized by a second temperature and said lower support comprising a plurality of support elements for supporting the chuck on the base; and
non-constraining attachment means for holding the upper and lower supports together and holding the lower support and the base together while allowing substantially continuous relative movement between layers of the chuck caused by thermal expansion forces due to differential temperature effects between the layers of the chuck.

2. The chuck of claim 1 wherein the non-constraining attachment means comprises a vacuum.

3. The chuck of claim 1 wherein the non-constraining attachment means comprises at least one spring.

4. The chuck of claim 1 wherein the non-constraining attachment means comprises of at least one resilient washer.

5. The chuck of claim 1 wherein the non-constraining attachment means holds the workpiece on the upper support.

6. The chuck of claim 1 wherein the upper support comprises an electrically insulating material.

7. The chuck of claim 1 wherein the upper support comprises a ceramic material.

8. The chuck of claim 1 wherein the non-constraining attachment means comprises a patterned upper surface formed on the upper support for distributing vacuum to a bottom surface of the workpiece.

9. The chuck of claim 8 wherein the upper support further comprises a layer of metal formed over the patterned upper surface.

10. The chuck of claim 1 wherein the non-constraining attachment means comprises a patterned lower surface on the upper support for distributing vacuum on the patterned lower surface to hold the upper support to the lower support.

11. The chuck of claim 1 wherein said upper support includes a guard comprising a layer of metal.

12. The chuck of claim 1 wherein said lower support comprises at least one alignment pin protruding through a top surface of said lower support, said alignment pin being inserted into at least one corresponding alignment hole in a bottom surface of said tipper support when said upper and lower supports are held together.

13. The chuck of claim 12 wherein the at least one alignment pin is press fit into said lower support.

14. The chuck of claim 12 wherein at least one alignment hole is elongated to allow relative radial movement between the lower support and upper support while preventing relative rotation between the upper support and lower support.

15. The chuck of claim 1 wherein said lower support comprises a heater for supplying heat to the workpiece.

16. The chuck of claim 15 further comprising a heat sink located between said heater and said upper support for controlling temperature of the workpiece.

17. The chuck of claim 1 wherein said lower support comprises a heat sink for controlling temperature of the workpiece.

18. The chuck of claim 17 wherein said heat sink comprises means for circulating a temperature-controlled fluid therethrough.

19. The chuck of claim 1 wherein said lower support comprises a ring attached to a lower surface of said lower support for providing a vacuum seal between said chuck and said base.

20. The chuck of claim 1 wherein said support elements are made of a substantially thermally nonconductive material.

21. The chuck of claim 1 wherein said support elements are made of glass.

22. The chuck of claim 1 wherein said support elements are made of ceramic.

23. The chuck of claim 1 wherein said support elements are formed in the shape of spherical balls.

24. The chuck of claim 1 wherein said support elements are formed in the shape of cylinders.

25. The chuck of claim 24 wherein the cylinders are oriented vertically.

26. The chuck of claim 24 wherein the cylinders are oriented horizontally.

27. The chuck of claim 1 wherein the support elements are formed in the shape of posts.

28. The chuck of claim 27 wherein the posts are oriented vertically.

29. The chuck of claim 27 wherein the posts are oriented horizontally.

30. The chuck of claim 1 wherein the quantity of support elements is selected based on a desired chuck stiffness.

31. A method of supporting a workpiece with a chuck comprising:

providing an upper support on which the workpiece can be held, said upper support being characterized by a first temperature;

providing a lower support by which the chuck can be held to a base, said lower support being characterized by a second temperature;

providing in the lower support a plurality of support elements for supporting the chuck on the base; and holding the upper support and the lower support together in a non-constraining fashion and holding the lower support and the base together in a non-constraining fashion such that layers of the chuck can move substantially continuously relative to each other due to thermal expansion forces caused by differential temperature effects between the layers of the chuck.

32. The method of claim 31 wherein holding the upper support and the lower support together in a non-constraining fashion comprises applying a vacuum to the chuck.

33. The method of claim 31 wherein holding the upper support and the lower support together in a non-constraining fashion comprises applying at least one spring to the chuck.

34. The method of claim 31 wherein holding the upper support and the lower support together in a non-constraining fashion comprises applying at least one resilient washer to the chuck.

35. The method of claim 31 further comprising providing a heater in said lower support for heating said workpiece.

36. The method of claim 35 further comprising providing a heat sink in said lower support between said heater and said upper support for controlling temperature of said workpiece.

37. The method of claim 31 further comprising providing a heat sink in said lower support for controlling temperature of said workpiece.

38. The method of claim 37 further comprising circulating a temperature-controlled fluid through said heat sink.

* * * * *

UNITED STATES PATENT AND TRADEMARK OFFICE
CERTIFICATE OF CORRECTION

PATENT NO.: 6,073,681

DATED: June 13, 2000

INVENTOR(S): Paul A. Getchel, Kenneth M. Cole, Sr., and Henry A. Lynden

It is certified that error appears in the above-identified patent and that said Letters Patent is hereby corrected as shown below:

In claim 12 in place of "tipper," please insert - - upper - -.

Signed and Sealed this

Eighth Day of May, 2001

Attest:

NICHOLAS P. GODICI

Attesting Officer

Acting Director of the United States Patent and Trademark Office